United States Patent
Kim et al.

(10) Patent No.: US 9,030,823 B2
(45) Date of Patent: May 12, 2015

(54) HEAT DISSIPATION SYSTEM FOR POWER MODULE

(75) Inventors: Kwang Soo Kim, Gyunggi-do (KR); Do Jae Yoo, Gyunggi-do (KR); Young Ho Sohn, Gyunggi-do (KR); Bum Seok Suh, Gyunggi-do (KR); In Wha Jeong, Gyunggi-do (KR)

(73) Assignee: Samsung Electro-Mechanics Co., Ltd., Gyunggi-do (KR)

( * ) Notice: Subject to any disclaimer, the term of this patent is extended or adjusted under 35 U.S.C. 154(b) by 276 days.

(21) Appl. No.: 13/609,958

(22) Filed: Sep. 11, 2012

(65) Prior Publication Data

US 2013/0343002 A1    Dec. 26, 2013

(30) Foreign Application Priority Data

Jun. 22, 2012 (KR) .......... 10-2012-0067387

(51) Int. Cl.
| | |
|---|---|
| H05K 7/20 | (2006.01) |
| H01L 23/34 | (2006.01) |
| F28F 3/12 | (2006.01) |
| F28F 13/06 | (2006.01) |
| F28D 21/00 | (2006.01) |

(52) U.S. Cl.
CPC .......... *F28F 3/12* (2013.01); *F28D 2021/0028* (2013.01); *F28F 13/06* (2013.01); *H01L 2924/00* (2013.01); *H01L 2924/0002* (2013.01); *H05K 7/20927* (2013.01)

(58) Field of Classification Search
USPC ......... 361/688, 699–701, 702, 704, 707, 717, 361/719–720; 165/104.11, 104.14, 104.33, 165/185; 174/252; 257/714–715
See application file for complete search history.

(56) References Cited

U.S. PATENT DOCUMENTS

| | | | | |
|---|---|---|---|---|
| 6,432,750 | B2 | 8/2002 | Jeon | |
| 7,119,284 | B2 * | 10/2006 | Bel et al. ........................ | 174/252 |
| 7,460,369 | B1 * | 12/2008 | Blish, II ........................ | 361/699 |
| 7,957,132 | B2 * | 6/2011 | Fried ........................ | 361/679.47 |
| 8,422,218 | B2 * | 4/2013 | Fried et al. ............... | 361/679.47 |

FOREIGN PATENT DOCUMENTS

KR    10-2012-0054770    5/2012

OTHER PUBLICATIONS

Office action dated Sep. 2, 2013 from corresponding Korean Patent Application No. 10-2012-0067387 and its English summary provided by the clients.

* cited by examiner

*Primary Examiner* — Robert J Hoffberg
(74) *Attorney, Agent, or Firm* — Ladas & Parry, LLP

(57) ABSTRACT

Disclosed herein is a heat dissipation system for a power module, including: first cooling medium flow parts and second cooling medium flow parts allowing cooling media to flow in first and second directions, respectively.

10 Claims, 4 Drawing Sheets

(a)  (b)

HEAT DISSIPATION SYSTEM FOR POWER MODULE

CROSS REFERENCE TO RELATED APPLICATION

This application claims the benefit of Korean Patent Application No. 10-2012-0067387, filed on Jun. 22, 2012, entitled "Heat Dissipation System for Power Module", which is hereby incorporated by reference in its entirety into this application.

BACKGROUND OF THE INVENTION

1. Technical Field

The present invention relates to a heat dissipation system for a power module.

2. Description of the Related Art

As energy usage increases over the world, a great interest on the effective use of restricted energy has been taken. Hence, various structures of power semiconductor modules are expansively applied as shown in Patent Document 1, and thus, the demands of markets for the power semiconductor modules have more multi-functions and smaller sizes have been increased, but this causes the heat generation problem of electronic components, resulting in deteriorating performance of the whole modules.

Therefore, in order to increase efficiency of the power semiconductor module and secure high reliability, a high-heat dissipative power module package structure capable of solving the heat generation problem above has been requested.

Generally, a cooling system of a high-capacitance power semiconductor module is composed of a single-sided cooling system and a substrate where semiconductor devices constitute circuits (direct bonded copper (DBC), metal printed circuit board, ceramic substrate, or the like).

In the case of the power semiconductor module having this structure, the substrate is bonded to an upper surface of the single-sided cooling system by using a solder, a thermal interface material (TIM), or a thermal conductive grease.

These materials generally degrade heat dissipation characteristics, and thus, place limitations on heat dissipation characteristics of the power semiconductor module. Moreover, the cooling system has a structure where a flow passage is simply formed, and thus, restricts heat dissipation characteristics of a fluid.

PRIOR ART DOCUMENTS

Patent Document (Patent Document 1) U.S. Pat. No. 6,432,750 B 2002 Aug. 13

SUMMARY OF THE INVENTION

The present invention has been made in an effort to provide a heat dissipation system for a power module and a method therefor, capable of efficiently dissipating the heat of the power module by distributing the flow paths of the cooling media in different directions through a plurality of cooling medium flow parts.

According to a preferred embodiment of the present invention, there is provided a heat dissipation system for a power module, the heat dissipation system including: a first heat dissipation plate having one surface and the other surface and including a plurality of first cooling medium flow parts formed in one surface thereof at a predetermined depth, the first heat dissipation plate allowing a cooling medium to flow in a first direction through the first cooling medium flow parts; a second heat dissipation plate formed on the first heat dissipation plate; and heat dissipation pipes respectively inserted into the plurality of first cooling medium flow parts of the first heat dissipation plate and including second cooling medium flow parts allowing a cooling medium to flow in a second direction therethrough, wherein the first direction and the second direction are opposite to each other.

The first cooling medium flow parts and the second cooling medium flow parts may have cooling medium inlets therefor in opposite directions, respectively.

The first heat dissipation plate and the second heat dissipation plate may have heat dissipation pipe-coupling grooves, respectively.

The heat dissipation pipe may be inserted into the heat dissipation pipe-coupling grooves respectively formed in the first heat dissipation plate and the second heat dissipation plate.

The first cooling medium flow part may be divided into a plurality of flow paths based on the heat dissipation pipe.

The cooling media flowing through the first cooling medium flow parts and the second cooling medium flow parts may be different kinds of cooling media.

The cooling media each may be gas or liquid.

The heat dissipation system may further include an insulating layer formed on the second heat dissipation plate.

The heat dissipation system may further include a metal layer including circuit patterns formed on the insulating layer.

The heat dissipation system may further include semiconductor devices formed on the metal layer.

The first heat dissipation plate and the second heat dissipation plate each may be formed of a metal material or a ceramic material.

According to another preferred embodiment of the present invention, there is provided a heat dissipation system having first cooling medium flow parts and second cooling medium flow parts allowing cooling media to flow in first and second directions, respectively.

The heat dissipation system may include: a first heat dissipation plate having one surface and the other surface and including a plurality of first cooling medium flow parts formed in one surface thereof at a predetermined depth, the first heat dissipation plate allowing a cooling medium to flow in a first direction through the first cooling medium flow parts; a second heat dissipation plate formed on the first heat dissipation plate; and heat dissipation pipes respectively inserted into the plurality of first cooling medium flow parts of the first heat dissipation plate and including second cooling medium flow parts allowing a cooling medium to flow in a second direction therethrough, wherein the first direction and the second direction are opposite to each other.

The first cooling medium flow parts and the second cooling medium flow parts may have cooling medium inlets therefor in opposite directions, respectively.

The heat dissipation system may further include an insulating layer formed on the second heat dissipation plate.

The heat dissipation system may further include a metal layer including circuit patterns formed on the insulating layer.

The heat dissipation system may further include semiconductor devices formed on the metal layer.

The cooling media flowing through the first cooling medium flow part and the second cooling medium flow part may be different kinds of cooling media.

BRIEF DESCRIPTION OF THE DRAWINGS

The above and other objects, features, and advantages of the present invention will be more clearly understood from the following detailed description taken in conjunction with the accompanying drawings, in which.

DESCRIPTION OF THE PREFERRED EMBODIMENTS

Figure 1:
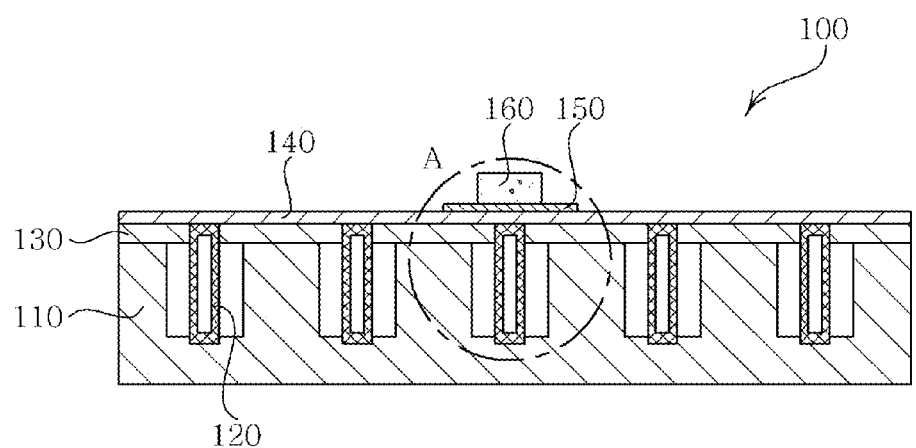
FIG. 1 is a cross-sectional view showing a structure of a heat dissipation system for a power module according to a preferred embodiment of the present invention.

The objects, features and advantages of the present invention will be more clearly understood from the following detailed description of the preferred embodiments taken in conjunction with the accompanying drawings. Throughout the accompanying drawings, the same reference numerals are used to designate the same or similar components, and redundant descriptions thereof are omitted. Further, in the following description, the terms "first", "second", "one side", "the other side" and the like are used to differentiate a certain component from other components, but the configuration of such components should not be construed to be limited by the terms. Further, in the description of the present invention, when it is determined that the detailed description of the related art would obscure the gist of the present invention, the description thereof will be omitted.

Hereinafter, preferred embodiments of the present invention will be described in detail with reference to the attached drawings.

Heat Dissipation System for Power Module

Figure 2:
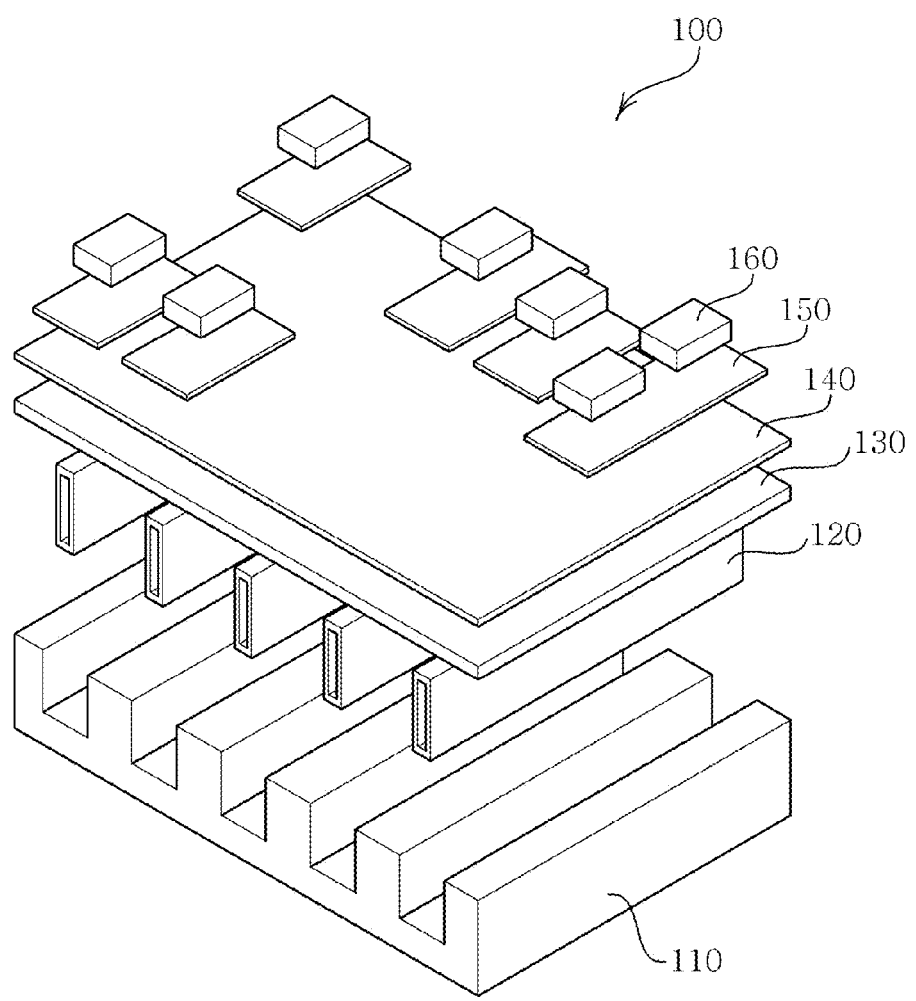
FIG. 2 is an exploded perspective view showing the structure of the heat dissipation system for a power module according to the preferred embodiment of the present invention.
Figure 3:
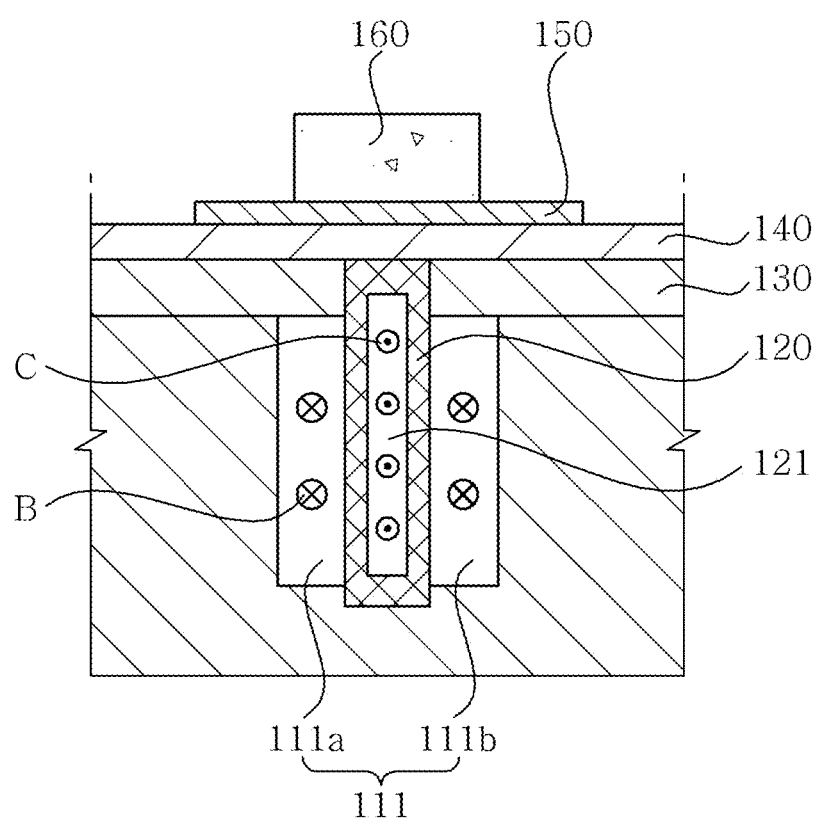
FIG. 3 is an enlarged cross-sectional view showing Region A of FIG. 1.

FIG. 1 is a cross-sectional view showing a structure of a heat dissipation system for a power module according to a preferred embodiment of the present invention; FIG. 2 is an exploded perspective view showing the structure of the heat dissipation system for a power module according to the preferred embodiment of the present invention; FIG. 3 is an enlarged cross-sectional view showing Region A of FIG. 1; and FIG. 4 is a view for explaining an example of heat dissipation in the heat dissipation system for a power module according to a preferred embodiment of the present invention.

Figure 4:
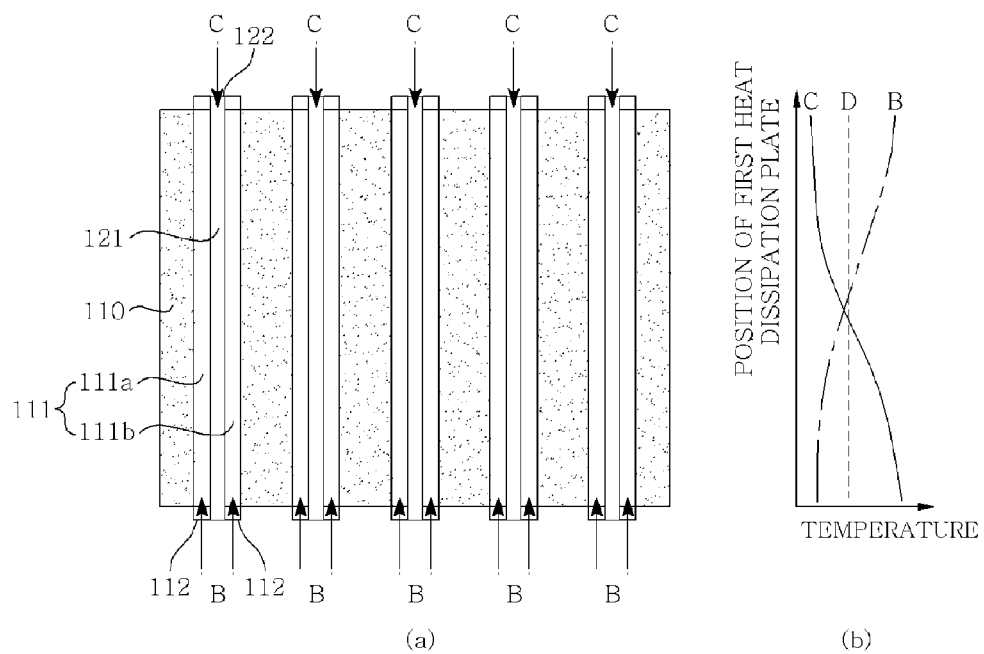
FIG. 4 is a view for explaining an example of heat dissipation in the heat dissipation system for a power module according to a preferred embodiment of the present invention.

As shown in FIGS. 1, 3, and 4, a heat dissipation system 100 for a power module may include first cooling medium flow parts 111 and second cooling medium flow parts 121 allowing cooling media in first and second directions, respectively.

More specifically, as shown in FIGS. 1 and 2, the heat dissipation system 100 for a power module may include a first heat dissipation plate 110, heat dissipation pipes 120, a second heat dissipation plate 130, an insulating layer 140, a metal layer 150, and semiconductor devices 160.

First, the first heat dissipation plate 110 may have one surface and the other surface, and may include the plurality of first cooling medium flow parts (111 of FIG. 3) formed in one surface thereof at a predetermined depth. The first heat dissipation plate may allow a cooling medium to flow in the first direction through the first cooling medium flow parts 111.

As shown in FIGS. 2 and 3, the first cooling medium flow part 111 may be a flow passage formed by a groove is formed in one surface of the first heat dissipation plate 110 at a predetermined depth.

In addition, as shown in FIGS. 1 and 3, the heat dissipation pipes 120 may be inserted in the plurality of first cooling medium flow parts 111 of the first heat dissipation plate 110 and include second cooling medium flow parts allowing a cooling medium to flow in a second direction.

Here, the heat dissipation pipe 120 may be formed of a metal material having high heat conductivity, such as, copper, stainless steel, or aluminum, or a ceramic material.

As shown in FIG. 1, the second heat dissipation plate 130 may be formed on the first heat dissipation plate 110.

Here, the first heat dissipation plate 110 and the second heat dissipation plate 130 may have heat dissipation pipe-coupling grooves (not shown), respectively.

As shown in FIG. 3, the heat dissipation pipe 120 may be inserted into the heat dissipation pipe-coupling grooves, which are respectively formed in the first heat dissipation plate 110 and the second heat dissipation plate 130.

In addition, the second heat dissipation plate 130 may be combined with the other constitutions of the heat dissipation system, including the first heat dissipation plate 110, by various methods, such as, welding, mechanical combination using an O-ring, combination using a waterproof and heat-resistant adhesive, and the like, in order to prevent water leak of the cooling medium.

Meanwhile, as shown in (a) of FIG. 4, in the plurality of first cooling medium flow parts 111 and second cooling medium flow parts 121, cooling medium inlets 112 and 122 therefor are respectively formed in opposite directions, and thus, the first direction and the second direction in which the cooling media B and C may be directions opposite to each other.

The above-described structure may be anticipated that the temperature of the cooling medium is uniformly maintained, as shown in (b) of FIG. 4.

More specifically, the cooling medium B flowing in through the first cooling medium flow parts 111 has a low temperature at the initial stage, but is relatively raised to a high temperature due to the heat generated from the power module while passing through the first cooling medium flow parts 111, and then is maintained at a constant temperature without rapid temperature increase under the influence of the cooling medium C flowing in through the second cooling medium flow parts 121.

This may be also applied to the second cooling medium B in the same manner.

That is, in the heat dissipation system 100 for a power module of the present invention, the temperature of the cooling medium increases as the cooling medium flows in the cooling medium flow part, but the cooling medium is maintained at a temperature of D by the cooling medium flowing in the opposite direction.

Therefore, the heat dissipation system 100 for a power module according to the present invention uniformly distribute the heat through the cooling media flowing in the opposite direction, so that the heat generated from the power module can be efficiently dissipated.

Meanwhile, flowing directions of the cooling media in the first cooling medium flow parts 111 and the second cooling medium flow parts 121 are not limited to the opposite directions, and may be changed depending on the needs of the operators.

In addition, as shown in FIG. 3, the first cooling medium flow part 111 may be divided into a plurality of flow passages 111a and 111b based on the heat radiation pipe 120.

In addition, the cooling media flowing through the first cooling medium flow parts 111 and the second cooling medium flow parts 121 may be different kinds of cooling media, respectively.

The above-described cooling media may be gas or liquid, and for example, may be air, cooling water, coolant, or the like.

For example, the first cooling medium flow part 111 and the second cooling medium flow part 121 may allow air and cooling water to flow therethrough, respectively.

In addition, when the first cooling medium flow part 111 and the second cooling medium flow part 121 allow air and cooling water to flow therethrough, respectively, the cooling air may cool the second cooling medium flow part 121 and also lower the temperature of the first cooling medium flow part 111 itself at the same time.

In addition, the heat dissipation system 100 for a power module may further include the insulating layer 140 formed on the second heat dissipation plate 130, the metal layer 150 including circuit patterns formed on the insulating layer 140, and the semiconductor devices 160 formed on the metal layer 150.

Here, the insulating layer 140 may be formed through a sol-gel coating process, a ceramic plate eutectic bonding process, an organic resin sheet process, an organic resin coating process, or the like.

For example, the insulating layer 140 may be formed of any material that can have voltage resistance and high heat conductivity, including an organic resin containing a high-heat conductive ceramic material or an inorganic filler, or the like.

In addition, the metal layer 150 may be formed by drying sputtering, wet electroless plating/electroplating, or a method of directly bonding a metal plate or a foil.

For example, the metal layer 150 may be formed of copper, copper and nickel (Cu/Ni), copper and titanium (Cu/Ti), gold/platinum/nickel/copper (Au/Pt/Ni/Cu), or gold/platinum/nickel/copper/titanium (Au/Pt/Ni/Cu/Ti), but is not limited thereto.

In addition, the semiconductor device 160 may be a heat generation type power semiconductor device, such as, an insulated gate bipolar mode transistor (IGBT), a fast recovery diode (FRD), a metal oxide semi-conductor field effect transistor (MOSFET), or the like, but is not limited thereto. For example, the semiconductor device 160 may be a control device such as a driver IC.

In addition, the first heat dissipation plate 110 and the second heat dissipation plate 130 may be formed of a metal material or a ceramic material.

For example, the first heat dissipation plate 110 and the second heat dissipation plate 130 may be formed of a metal material having high heat conductivity such as aluminum, copper, iron, or the like, or a ceramic material such as $Al_2O_3$, $ZrO_2$, AlN, BN, SiN, or the like.

In the present preferred embodiment, since the insulating layer 140 and the metal layer 150 are directly formed on the second heat dissipation plate 130, a bonding interface between materials for increasing heat resistance is minimized. In addition, since the second heat dissipation plate 130 having a circuit is combined with the first heat dissipation plate 110 without separate manufacture of a circuit board, heat dissipation characteristics are further improved.

In addition, since the present preferred embodiment employs a water cooling and air cooling mixed heat dissipation system by using the first cooling medium flow parts 111 and the second cooling medium flow parts 121, the uniform temperature distribution is achieved, thereby improving heat dissipation characteristics.

As set forth above, the heat dissipation system for a power module according to the preferred embodiment of the present invention allows the cooling media to flow in different directions by including a plurality of cooling medium flow parts, and thus, can uniformly distribute the heat generated from the power module, resulting in enhancing heat dissipation effect.

Further, in the present invention, since the heat dissipation pipe is inserted in the heat dissipation plate, the design of the heat dissipation pipe can be varied, and thus, the design degree of the heat dissipation system including the cooling medium flow parts can be improved.

Further, in the present preferred embodiment, different kinds of cooling media can be applied to the plurality of cooling medium flow parts, and thus, the heat generated from the power module can be uniformly distributed by using characteristics between the cooling media.

Although the embodiments of the present invention have been disclosed for illustrative purposes, it will be appreciated that the present invention is not limited thereto, and those skilled in the art will appreciate that various modifications, additions and substitutions are possible, without departing from the scope and spirit of the invention.

Accordingly, any and all modifications, variations or equivalent arrangements should be considered to be within the scope of the invention, and the detailed scope of the invention will be disclosed by the accompanying claims.

What is claimed is:

1. A heat dissipation system for a power module, the heat dissipation system comprising: a first heat dissipation plate having a top surface and a bottom surface and including a plurality of first cooling medium flow path units formed in the top surface thereof at a predetermined depth, the first heat dissipation plate allowing a first cooling medium to flow in a first direction through the first cooling medium flow path units; a second heat dissipation plate formed on the first heat dissipation plate; and heat dissipation pipes respectively inserted into the plurality of first cooling medium flow path units of the first heat dissipation plate and including second cooling medium flow path units allowing a second cooling medium to flow in a second direction therethrough, wherein the first direction and the second direction are opposite to each other, and wherein each of the first cooling medium flow path units is divided into a plurality of first cooling medium flow paths based on a respective one of the heat dissipation pipes inserted in each of the first cooling medium flow path units.

2. The heat dissipation system as set forth in claim 1, wherein the first cooling medium flow path units have first cooling medium inlets on a first end of the heat dissipation plate and the second cooling medium flow path units have second cooling medium inlets on a second end of the heat dissipation plate, the second end opposite the first end.

3. The heat dissipation system as set forth in claim 1, wherein the first heat dissipation plate and the second heat dissipation plate have heat dissipation pipe-coupling grooves, respectively.

4. The heat dissipation system as set forth in claim 3, wherein the heat dissipation pipe is inserted into the heat dissipation pipe-coupling grooves respectively formed in the first heat dissipation plate and the second heat dissipation plate.

5. The heat dissipation system as set forth in claim 1, wherein the first cooling medium and the second cooling medium are different kinds of cooling medium.

6. The heat dissipation system as set forth in claim 1, wherein the first and second cooling mediums each are a gas, a liquid, or a mixture of the gas and the liquid.

7. The heat dissipation system as set forth in claim 1, further comprising an insulating layer formed on the second heat dissipation plate.

8. The heat dissipation system as set forth in claim 7, further comprising a metal layer including circuit patterns formed on the insulating layer.

9. The heat dissipation system as set forth in claim 8, further comprising semiconductor devices formed on the metal layer.

10. The heat dissipation system as set forth in claim 1, wherein the first heat dissipation plate and the second heat dissipation plate each are formed of a metal material or a ceramic material.

* * * * *